United States Patent
Stevens et al.

(10) Patent No.: US 7,474,979 B1
(45) Date of Patent: Jan. 6, 2009

(54) INTEGRATED CIRCUIT DEVICE TEST SYSTEM AND METHOD

(75) Inventors: Lance Stevens, Burnsville, MN (US); Virgilio Velasco, Bloomington, MN (US); Anand Prithivathi, Bloomington, MN (US); Anthony Schmitz, St. Paul, MN (US)

(73) Assignee: Cypress Semiconductor Corporation, San Jose, CA (US)

( * ) Notice: Subject to any disclaimer, the term of this patent is extended or adjusted under 35 U.S.C. 154(b) by 32 days.

(21) Appl. No.: 11/643,198

(22) Filed: Dec. 20, 2006

Related U.S. Application Data (60) Provisional application No. 60/752,845, filed on Dec. 20, 2005.

(51) Int. Cl.
*G06F 15/00* (2006.01)
(52) U.S. Cl. .......................... 702/119; 438/5
(58) Field of Classification Search ............... 702/117, 702/118, 119, 182–185; 438/5
See application file for complete search history.

(56) References Cited

U.S. PATENT DOCUMENTS

| | | | |
|---|---|---|---|
| 6,800,495 B2 | 10/2004 | Payan et al. | 438/14 |
| 6,885,955 B1 | 4/2005 | Atchison | 702/81 |
| 2007/0236232 A1* | 10/2007 | Aghababazadeh et al. | 324/751 |

* cited by examiner

*Primary Examiner*—Edward Raymond
(74) *Attorney, Agent, or Firm*—Haverstock & Owens, LLP (57) ABSTRACT

A method for integrated device testing can include the steps of: receiving wafer test data that identifies wafer test failures with the dice tested while part of a shared common substrate; receiving package test data that identifies test failures for at least a subset of the dice after the dice have been separated and assembled into different packages; identifying non-unique coverage test sets that include at least one wafer test or package test that generates failures that correlates with failures generated by another wafer test or package test for the same dice; and identifying unique coverage tests that include failures generated by wafer tests or package tests that do not correlate with failures generated by any other another wafer test or package test for the same dice.

20 Claims, 12 Drawing Sheets

FIG. 1

| 23_MVMMap_01_20 | 24_MVMMap_21_40 | 25_MVMMap_41_60 | 26_MVMMap_61_80 |
|---|---|---|---|
| 527872 | 345088 | 17 | 1025 |

80E00 (HEX) --> 1000 - 0000 - 1110 - 0000 - 0000 --> TN Failing = 20, 12, 11, 10

| Test Number | Test_Name | | | | | | |
|---|---|---|---|---|---|---|---|
| 1 | PinOpenShort_x | 21 | LoLW_x | 41 | LoPoslsb2So2_x | 61 | Lo1AcWLV_1_x |
| 2 | VccShort_x | 22 | HiLW_x | 42 | LoPoslsb2So2_x3 | 62 | Hi1ACWLV_1_x |
| 3 | VccOpen_x | 23 | LHBounceCk1_x | 43 | LoPosDellsb2_x | 63 | Lo1ACWHV_1_x |
| 4 | NmGF_x | 24 | LHBounceCk2_x | 44 | lsb2StrDelFinal_x | 64 | Hi1ACWHV_1_x |
| 5 | NmGF3_x | 25 | HLBounceCk1_x | 45 | LoSlowTsce_x | 65 | Lolsb1_1_x |
| 6 | NmByteAccessNS_x | 26 | HLBounceCk2_x | 46 | HiInpLev_x | 66 | Hilcc_1_x |
| 7 | NmTristateNS_x | 27 | NLRdDistCk1_x | 47 | HiInpLevH_x_1 | 67 | Lo1AcWLV_2_x |
| 8 | NmPtmWFunc_x | 28 | NLRdDistCk2_x | 48 | LoInpLev_x | 68 | Hi1ACWLV_2_x |
| 9 | NmPtmRFunc_x | 29 | NLRdDistCkIntc1_x | 49 | LoInpLevH_x_1 | 69 | Lo1ACWHV_2_x |
| 10 | NmVmonV_x | 30 | NLRdDistCkIntc2_x | 50 | HiInputStr_x | 70 | Hi1ACWHV_2_x |
| 11 | LoPreIsb2Ck1_x | 31 | NLDRetCk1_x | 51 | LoInputStr_x | 71 | Lolsb1_2_x |
| 12 | LoPreIsb2Ck2_x | 32 | NLDRetCk2_x | 52 | LoSeqInLeak_x | 72 | Hilcc_2_x |
| 13 | lsb2StrDelRef_x | 33 | LoSITaaGC_x | 53 | HiSeqInLeak_x | | |
| 14 | NHDcStrCk1_x | 34 | HiSITaaGC_x | 54 | HiSeqOutLeak_x | | |
| 15 | NHDcStrCk2_x | 35 | LoPoslsb2Ck1_x | 55 | LoSeqOutLeak_x | | |
| 16 | LoCorner1_x | 36 | LoIdrIsb2Ck1_x | 56 | LoDcVoh_x | | |
| 17 | LoCorner2_x | 37 | LoPoslsb2Ck2_x | 57 | LoDcVohH_x_1 | | |
| 18 | HiCorner1_x | 38 | LoIdrIsb2Ck2_x1 | 58 | LoDcVol_x | | |
| 19 | HiCorner2_x | 39 | LoPoslsb2So1_x | 59 | HiDcVolH_x_1 | | |
| 20 | PowerUpIsb | 40 | LoPoslsb2So1_x2 | 60 | Hilcc1000ns_x | | |

```
TEST SUMMARY

Test    18    =   252   Gross Func 1 - Failed Out

Test    28    =     6   DCIsb1 & DCIsb2 - Failure

Test    29    =     6   DCIsb1 & DCIsb2 - Failed Out

Test    63    =     1   Data Retention - Failed Out

Test    77    =     2   Address Access Failure
```

FIG. 12 (BACKGROUND ART)

INTEGRATED CIRCUIT DEVICE TEST SYSTEM AND METHOD

This application claims the benefit of U.S. Provisional Patent Application Ser. No. 60/752,845, filed Dec. 20, 2005, the contents of which are incorporated by reference herein.

TECHNICAL FIELD

The present invention relates generally to electronic manufacturing processes, and in particular to processes for testing integrated circuit device.

BACKGROUND OF THE INVENTION

The manufacturing of integrated circuit (IC) devices can be conceptualized as including a "front end" and a "back end". A typical front end of a process can include a "wafer sort". A wafer sort can be the testing of IC devices in wafer form. That is, devices can still be formed as part of the wafer, typically a silicon wafer, in which they have been fabricated. Subsequently, a wafer can be cut (e.g., sawn, laser cut) to separate the individual IC devices, each of which is referred to as a die (or "chip").

A typical back end of a manufacturing process can include packaging IC devices received in die form, into a predetermined type of IC package. Typically, packaged devices are placed into a tester and sorted according to failure and/or performance criteria.

Both front end (sort) and back end (package) sort can be very important in ensuring quality control for electronic device manufacturers. Such testing can also be used to gather data, which generates information to improve quality, yields, and costs.

Conventional data gathering and information analysis solutions used at sort or package test include downloading all test summaries and gathering test counters. Test counters include counts of how many failures a particular test-algorithm generates over a selected sample size. Test counters can be searched for tests that have a zero or very low (parts per million) ppm fail rate.

Conventionally, every test in a test program can have its associated fail test counter. For such a test counter, each time the associated test is failed, the test counter can be incremented by 1 and the tested die can be "binned out". For example, if there are 20 tests and a die fails the first test, the test counter for the test can be incremented, and the die can be tagged as a fail, and testing for that die will be discontinued. In this way, failing die can be identified and removed from any further testing.

Figure 12:
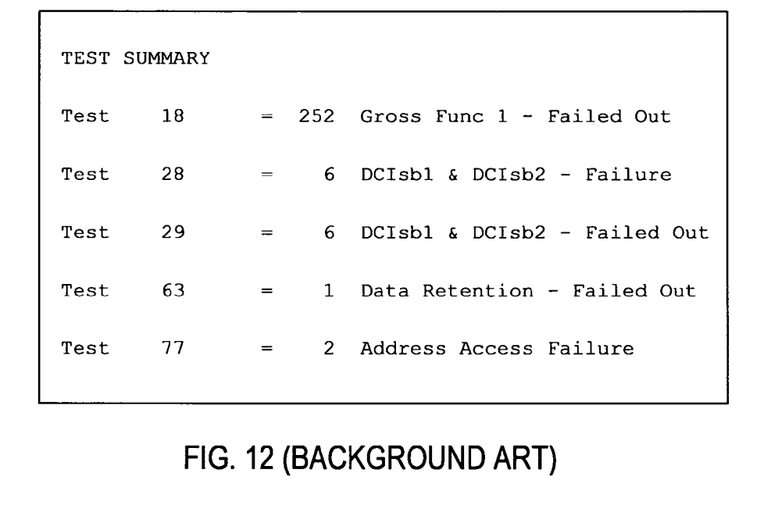
FIG. 12 is a table illustrating a conventional fail test counter.

Referring now to FIG. 12, a table is shown that illustrates an example of conventional fail test counters for a wafer sort operation. FIG. 12 shows test counters for five wafer sort tests: Tests 18, 28, 29, 63, and 77. Test 18 shows that the test associated to this counter has 252 failures in testing the whole wafer, test 18 shows 6 failures, etc. It is understood that FIG. 12 shows only those tests that have generated a failure. Test counters of other tests that have zero failures are not shown.

By accumulating all test summaries like those of FIG. 12, a user can find tests that are not listed (e.g. have zero failures), or that have a low ppm rate of failure. Such tests can then be considered candidates for removal from an overall test program.

Conventionally, prior to removing a test from a test program, it has been considered necessary to ensure that removal of the test does not allow failing devices to escape an overall test program. Thus, a candidate test or tests can be disabled, and then numerous wafers (e.g., thousands of die), can be retested to observe if any change in overall testing results has occurred. If no change occurs, the candidate test(s) can be removed from the test program. This can be costly to implement as increased testing time can translate into increase costs.

Conventionally, test counters can have a primary purpose of differentiating test failures that are grouped into a single "hard-bin" category. For example, a "Bin 7" may contain the sum of failures for multiple tests: Low-Corner1 (tn 130), Low-Corner2 (tn 131), Hi-Corner-1 (tn 230), and Hi-Corner-2 (tn 231), where each "Corner" can represent a limit in acceptable performance. Conventional test counters can thus be variables used to cumulatively count how many times each test fails, allowing differentiation between each test. The example of "Bin-7" above shows the sum of four preceding tests.

In a conventional solution, test counters are generated only from sort summaries. Every time a test fails it increments a counter. The conventional solution can perform a front end to back end correlation to ensure that tests removed from wafer sort with zero or low ppm fails rates do not end up missing failures appearing at a back end of the manufacturing process. Such a conventional approach can require considerable engineering work to gather the necessary data, which can expensive and slow. Further, such approaches may yield results for only a limited sample size.

It is noted that conventional approaches to correlating front end to back end test results do not provide information on whether a particular test is unique in its test coverage. Furthermore, when dealing with multiple family densities, the conventional solution may only compare defect density by device, as opposed to by family.

As understood from above, a goal of the conventional solution can be to disable tests at a front end (FE) or a back end (BE) that are non-value added (i.e., do not capture any defects). In such an approach, a test in a front-end flow can be removed, and tests can be executed with a resulting reduced test sequence. A "Qualification Test Plan (QTP)" can then be performed in a back-end to observe if quality has remained unchanged. If quality and yield is the same in the BE, the FE test can be disabled.

The above conventional solution can be inaccurate and inefficient because there can be no direct way of telling which die fails which particular tests. Furthermore, the benefit realized by such an approach can be limited, as only the zero failure tests can be removed (and such tests can be rare) and tests having a low ppm fail rate require a thorough correlation between front and backend before they can be removed.

DETAILED DESCRIPTION

Various embodiments of the present invention will now be described in detail with reference to a number of drawings. The embodiments show testing methods and systems that can identify tests for removal from a test program with greater accuracy and less time consumption than conventional approaches, like those noted above.

Figure 1:
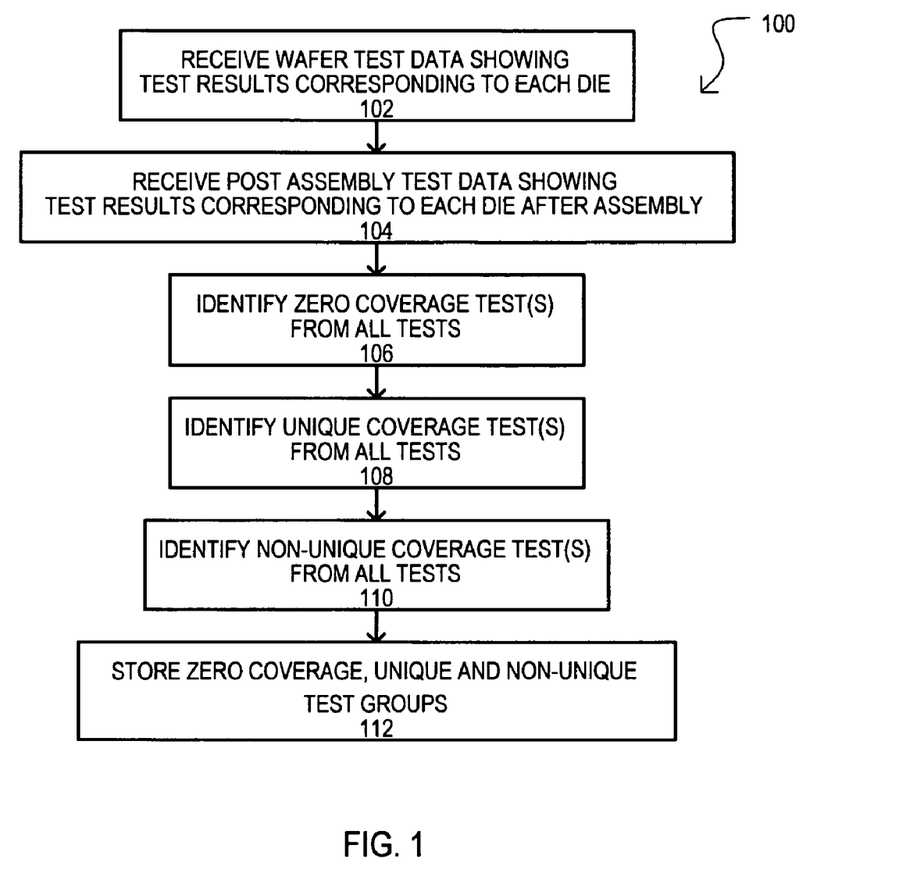
FIG. 1 is a flow diagram of a first embodiment of the present invention.

Referring now to FIG. 1, a method according to a first embodiment is shown in a flow diagram and designated by the general reference character 100. A method 100 can include receiving wafer test data showing wafer test results corresponding to each die (step 102). Such a step can include testing integrated circuit (IC) devices in wafer form (e.g., ICs formed in a common substrate for subsequent separation). Wafer testing (e.g., wafer sort) can be considered a "front end" of a manufacturing process.

A method 100 can also include receiving post assembly test data showing test results corresponding to each die after assembly (step 104). Such a step can include testing IC devices after such devices have been assembled. An IC device assembly can include an IC after it has been placed in a package, typically for easier inclusion in a system or larger electronic devices. While some package types contain a single IC, other package types can include multiple ICs (e.g., multi-chip module).

A method 100 can then characterize both test types (wafer test and assembly test). In the particular example shown, a method 100 can identify zero coverage test(s) (step 106). A zero coverage test can be a test in that detects no, or some predetermined minimum number of failures. It is noted that zero coverage tests are taken from both wafer tests and package tests. A zero coverage test can be candidate for removal from a final test program, as it may not yield any significant failure data.

A method 100 can also identify unique coverage tests (step 108). A unique coverage test can be a test that provides no significant overlap with any other test. Again, unique coverage tests can be taken from both wafer tests and package tests. A unique coverage test can be retained in a final test program as it is most likely to contain significant test data. In addition, and as will be described in more detail below, unique coverage tests can identify block design weaknesses and/or problems with automated test generation programs.

Unlike conventional approaches noted above, a method 100 can also include identifying non-unique coverage tests from all tests (step 110). Non-unique coverage tests can be two or more tests that do not vary significantly from device to device. That is, one test yields essentially the same failure map as the other test(s). Again, because a method 100 acquires both wafer test and package test data for the same devices, a set of non-unique coverage tests can include both a wafer test and package test, and thus identify potentially redundant tests. Thus, provided one test of a non-unique coverage test group is retained, any or all of the remaining tests of the group can be omitted. A test from a non-unique group can be selected for removal based on cost, time required, or other criteria. For example, if a non-unique test group contains one wafer test and one package test, the package test can be omitted, as it is typically more costly to execute.

A method 100 can further include storing the various test classifications (step 112). Such test results can be retrieved to modify an overall test program, from a front end to a back end, and can identify device weaknesses in a family of devices and/o identify test program flaws.

In this way, a method can accumulate test data for the same IC devices at both a front end and back end of a manufacturing system, thus identifying tests that may provide redundant test coverage.

It is noted that the above embodiment is in contrast to conventional solutions in which, when there is a failure, one does not know if another test in an overall test flow will capture the same defect. In addition, conventionally, one does not know if another subsequent test(s) in the flow would fail to capture the same defect. That is, conventionally, one does not know precisely how individual tests are providing coverage with respect to one another. Embodiments described herein can provide such information.

Thus, according to a method like that of FIG. 1 and others described below, a test can be identified that is redundant and be removed with high a degree of confidence. This is in contrast to conventional solutions, where performing front end/backend cost reduction can require time consuming re-qualification after disabling a test, as it is unknown whether such a test is not unique. That is, uniqueness or redundancy of a test is conventionally determined via trial and error. When trying to perform yield enhancement according to such conventional approaches, one does not know quantitative independent effectiveness of a given test in test-flow sequence. In contrast, approaches like those of the described embodiments, can quickly and accurately identify tests as unique, not-unique or zero coverage.

Figure 2:
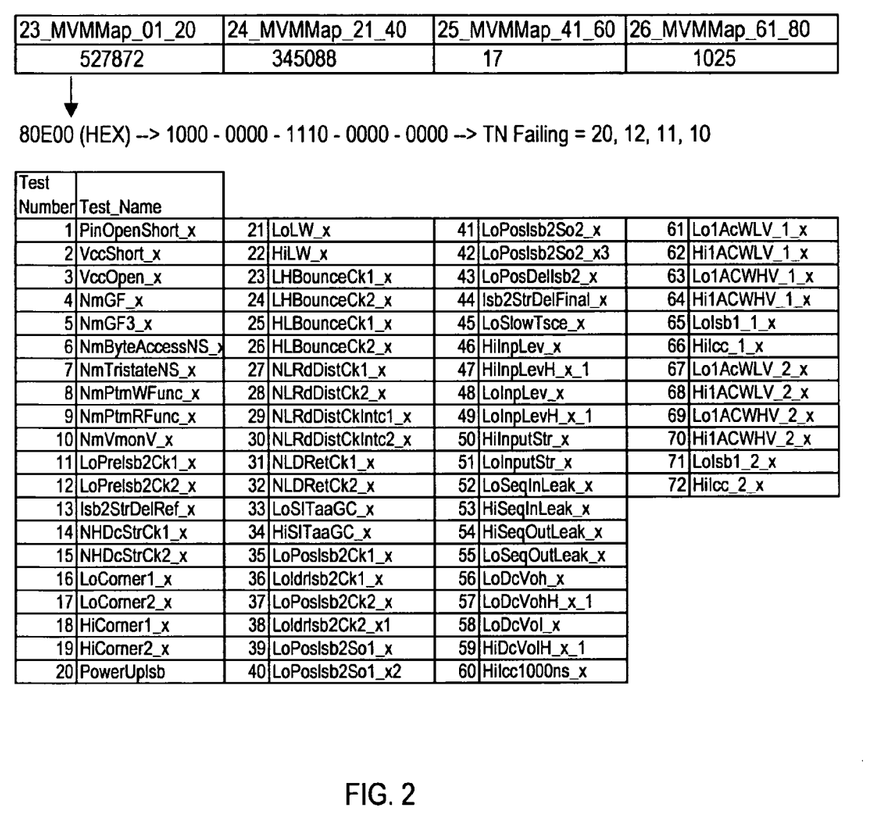
FIG. 2 is a table showing a data format that can be included and/or processed by the embodiments.

Referring now to FIG. 2, one example of a raw data capture according to an embodiment is shown in a block diagram. The example demonstrates pass-fail data captured for each test on a given die. It is understood that such a data capture can be repeated for each die. Each data capture like that of FIG. 2 can represent an exact die (e.g., X, Y position on wafer) location. This die location, which can be a die ID, can be tracked at the front end (FE), back end (BE) and/or customer location via an ID number programmed into or written on the device. As noted above, multiple data captures can allow tests to be separated into three groups: a zero coverage group, a unique-coverage group, and a non-unique coverage group.

Referring still to FIG. 2, in the specific embodiment shown, there can be 72 tests, mapped into four groups. The four groups are shown in the first row as 23_MVMMap_01-20, 23_MVMMap_2140, 25_MVMMap_41-60, and 26_MVMMap_61-80. Each map can be a decimal value that can be translated into a string of bits (in this case 20 bits), where each bit can correspond to a test of a test program. Each die can be tested with all tests in the test program and even if the die fails a test, it can continue to be tested until all tests have been completed. This is in contrast to conventional "binning", in which a die or packaged device can "bin out" (stop being tested after failing a particular test). In the example of FIG. 2, a test result status can be represented by a bit value being a "1" for a fail and "0" for a pass.

The second row of FIG. 2 shows how the decimal value of a first map "527872" can be converted to a hexadecimal value 80E00, which can translate into the forty-bit value "1000 000 1110 0000 0000". If a right most bit can be considered to be test number one, this binary value illustrates a die that fails tests 10, 11, 12 and 20.

Referring still to FIG. 2, the table below the second row shows a name of each test. It is understood that each die will have bits corresponding to this table since such maps will exist for each die.

In this way, test data can be acquired for front end and a back end tests can be translated between a binary form in which bit values represent test results, and non-binary representations of the same bit values (e.g., decimal, hexadecimal).

Figure 3A:
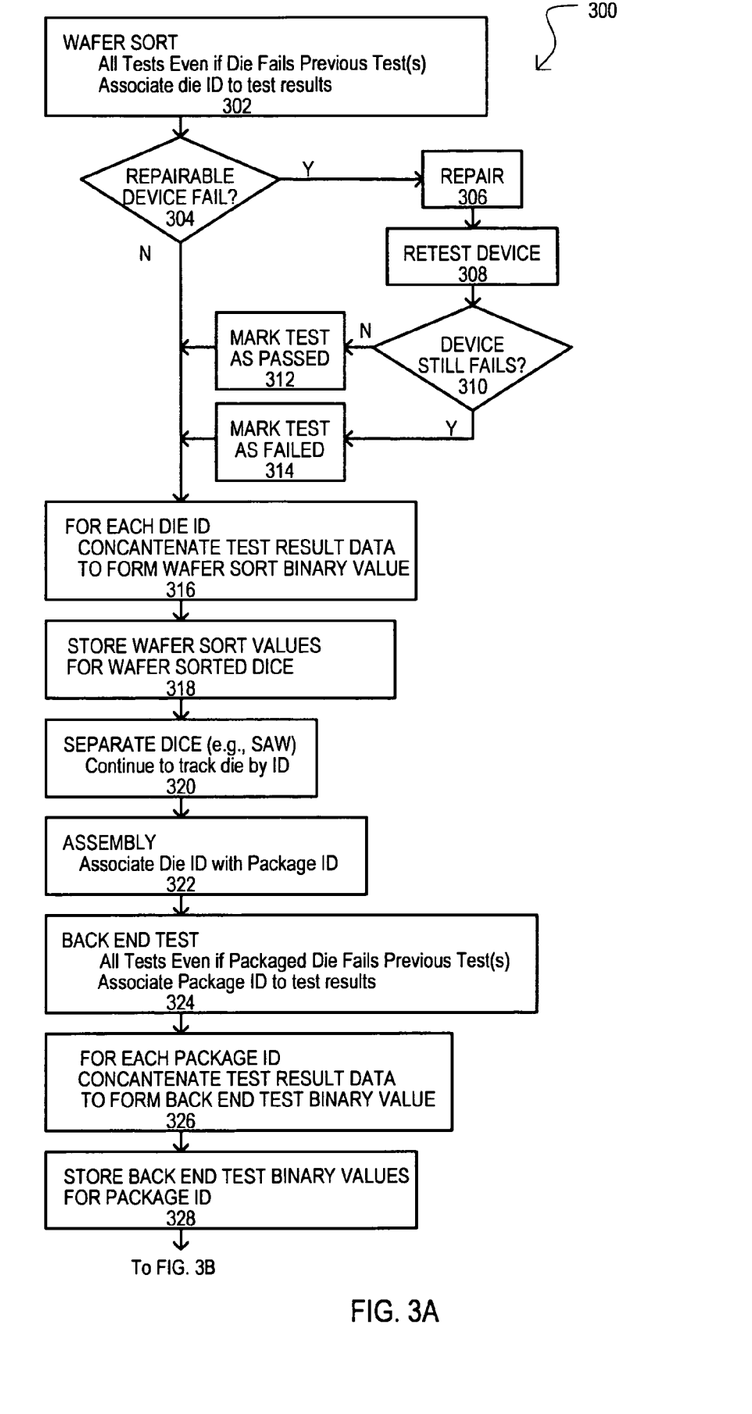
FIGS. 3A and 3B show a flow diagram of a second embodiment.
Figure 3B:
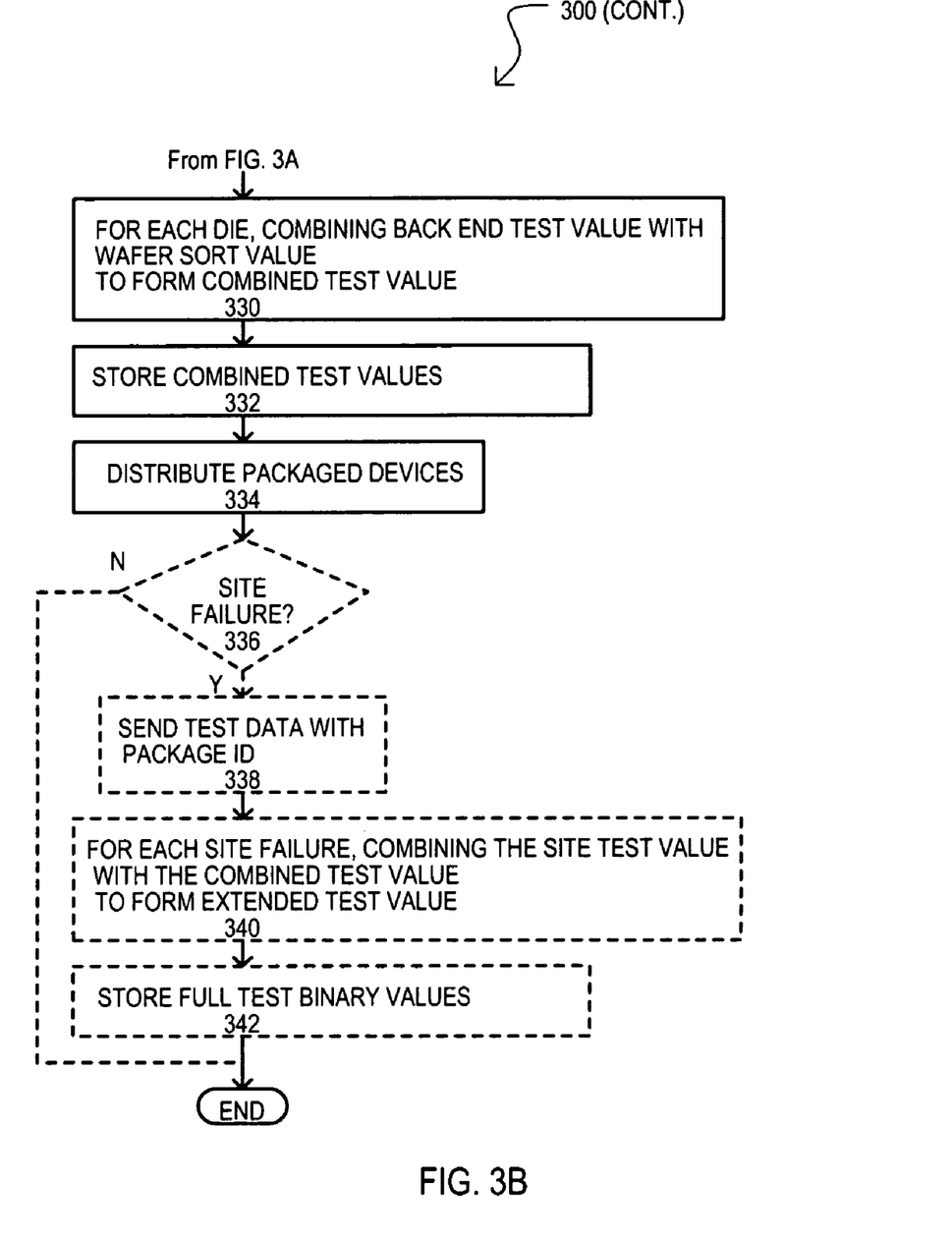

Referring now to FIGS. 3A and 3B a method according to another embodiment is shown in a block diagram and designated by the general reference character 300.

Referring now to FIG. 3A, a method 300 can include a wafer sort (step 302). Such a wafer sort step can perform all tests of a test program on all selected dice of a wafer. In addition, each tested die can be associated with its particular test results. Preferably such test data is acquired and stored as the tests take place. Thus, in a method according to this embodiment, each die under test (DUT) will be tested, and every single test of the program will have a status of which tests a die passed and failed. All tests in the flow will be executed regardless of pass/fail. Classifying a DUT as failing one or more particular tests ("bin out" result branching) will not result in testing end, and test data will continue to be collected for all of the test-flow.

The particular method of FIGS. 3A and 3B can be directed to repairable devices. Thus, method 300 can include determining if a repairable device has failed (step 304). As but one example, a repairable device can be a memory device having built in redundancy for replacing defective areas. Such built in redundancy is typically enabled via the opening of fusible links with a laser. If the device has failed (Y from 304), the device can be repaired (step 306). A repaired device can then be retested (step 308). If the device no longer fails the test (N from 310), the test can be marked as passed (step 312). However, if the device continues to fail the test (Y from 310), the test can be marked as failed (step 314). For example, in the case of a memory device, for pre-laser tests (i.e., pre-repair steps), failing bits can be captured via an error capture random access memory (RAM). After a laser step (i.e., repair step), a test status will be indicated as a fail if and only if new bits are identified as failing via error capture RAM analysis (i.e., the same bits continue to fail).

A method 300 can include, for each die, concatenating test result data to form a wafer sort binary value (step 316). Such a step can include forming one or more values like that shown in the second row of FIG. 2. Such a step can also include transforming such a binary value into a different format, such as a hexadecimal or decimal number. Such wafer sort values can then be stored (step 318).

A method 300 can further include separating a wafer into individual dice (step 320). For example, such a step can include sawing a wafer into individual dice. This step includes maintaining track of each die by a die ID. For example, the method can include storing die according to position and/or marking dice and/or programming devices with a value that can be cross referenced back to a position in a wafer.

Dice can then be subjected to an assembly location (step 322). This can include assembling dice into packages such as dual-inline-packages (DIPs), small outline packages (SOPs), or ball grid array packages (BGAs), to name but a few of the many possible examples. This step can also continue to track devices, with packaged devices maintaining some indication that can allow each packaged device to be associated with the wafer test data of the die (or dice) included in the package.

Assembled devices can then be subject to a back end test (step 324). As in the case of the wafer sort test, packaged devices can be subject to all tests regardless of test results for the packaged device. Test data can be associated to the die (or dice) included in the tested package.

A method can also include, for each package, concatenating test result data to form a back end test value (step 326). Like a step 316, this step can include forming one or more values like that shown in the second row of FIG. 2. Such a step can also include transforming such a binary value into a different format, such as a hexadecimal or decimal number. The back end test values can then be stored (step 328).

Referring now to FIG. 3B, a method 300 can further include combining back end test values and wafer sort values to form a combined test value (step 330). Such a combined test value can take the form of a binary string, or one or more non-binary values representing such a binary string. As but one very particular example, such a step can create a value like that shown in the second row of FIG. 2. Combined test values can then be stored (step 332).

A method 300 can also include distributing packaged devices (step 334). This step can result in devices being subject to additional testing at another site, for example by a distributor or end use customer.

Optionally, test data acquisition may not end with the distribution of a packaged device. Thus, method 300 may include optional steps 336, 338, 340 and 342. Such steps can include determining if a failure has occurred at a remote site (step 336). If a site failure exists (Y from 336), test data can be sent from the site along with a package ID (step 338). Such site test data can then be combined with the combined test value for the corresponding die to create an extended test value (step 340). Such a step can create a value like that shown in the second row of FIG. 2. An extended test value can then be stored (step 342).

In this way, test data can be gathered from all steps of a manufacturing process, including both front end and back end steps, and optionally after such devices have been shipped to distributors/customers. Such broad test data can then be utilized to automatically classify tests into various groups (e.g., zero coverage, unique coverage, non-unique coverage), and enable detection of particular types of defects or errors.

Methods and systems described herein can thus allow front end to back end cost reduction as non-unique coverage tests can be disabled based on data collected during all production testing. Data can be used across platforms, and allow project requirement dates to be met without any undue surprises.

Particular examples of how test data can detect particular defects will now be described.

Figure 4:
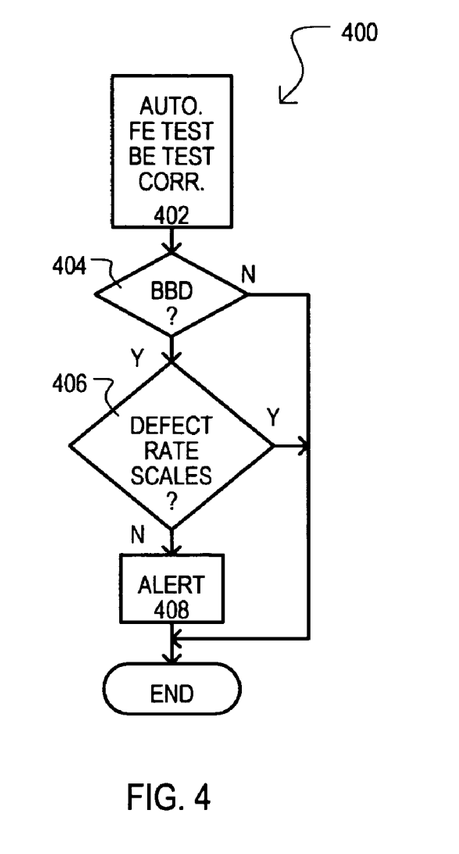
FIG. 4 is a flow diagram of a third embodiment.

Referring now to FIG. 4, a method according to another embodiment is shown in a flow diagram and designated by the general reference character 400. Method 400 can utilize acquired test data to detect potential defects and/or test flaws for block based IC designs.

A method 400 can include automatically correlating FE test data and BE test data according to any of the techniques described above or below (step 402). How a method 400 proceeds can depend upon whether a tested device is based on a block based design methodology (BBDM). A BBDM can re-use blocks of designed schematic/layout intellectual property (IP). This can result in multiple designs that function more alike, and so can increase first-pass yield success. Devices formed with the same re-useable blocks can be considered to belong to the same family. As but one very particular example, memory devices of differing size (densities) but composed of the same basic array structures, can be part of a same family.

If a tested device is based on a BBDM (Y from 404), the resulting test data can be tested to see of the error rate scales according to the number of repeated blocks (step 406). If error rates do not scale (N from 406), an alert can be generated (step 408) for the test to indicate there may be a design flaw in one member of a design family.

In this way, a method 400 can allow multiple family densities to be tested, and leverage similar device-design technology to achieve yield improvement across that design family. In particular, a test would be expected to generate a same defect rate for all family members. A different defect rate can signify a design weakness of the particular family member and/or test program flaw. Thus, a user can identify a device within a family having a weakness to a specific test, as such a test should not have uniqueness when compared to other family members.

Figure 5:
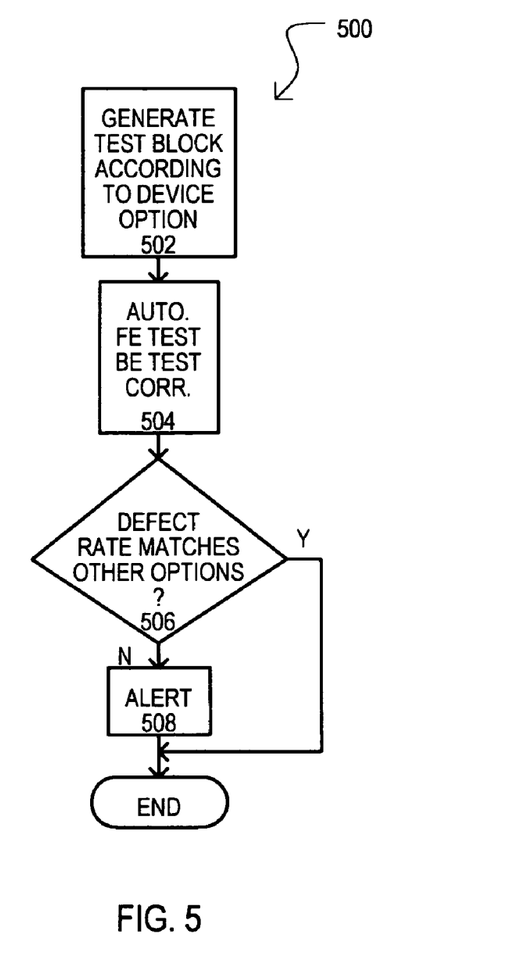
FIG. 5 is a flow diagram of a fourth embodiment.

Referring now to FIG. 5, a method according to another embodiment is shown in a flow diagram and designated by the general reference character 500. Method 500 can utilize acquired test data to detect potential defects and/or test flaws for different options of a same basic IC design.

A method 500 can include automatically generating a block of tests based on an IC device that is one option of a basic device design (step 502). Such a step can include generating a test program according an automated test program generation, such a conventional block based test methodology (BBTM).

Method 500 can further include automatically correlating FE test data and BE test data for the tested IC device option according to any of the techniques described above or below (step 504). Resulting test data can then be tested to see of the error rate matches that of other options of the same general IC device design (step 506). If error rates do not match (N from 506), an alert can be generated (step 508) for the test to indicate there may be a flaw in the particular option design, or in the test program generated.

In this way, an embodiment can be used in combination with BBTM. A BBTM can dictate that multiple device options within a design family should have similar/same fail rates by test and test-counter, thus, fail rates should be similar across FE to BE testing. If such a similarity is not detected, the particular option can be examined for flaws, or the test program generated through automation can be revised, or regenerated according to different options.

In this way, embodiments can quickly identify and differentiate any differences from device options (design) within a family (due to BBDM), and/or identify and differentiate any differences from test program generation (due to BBTM) for options of family.

Figure 6:
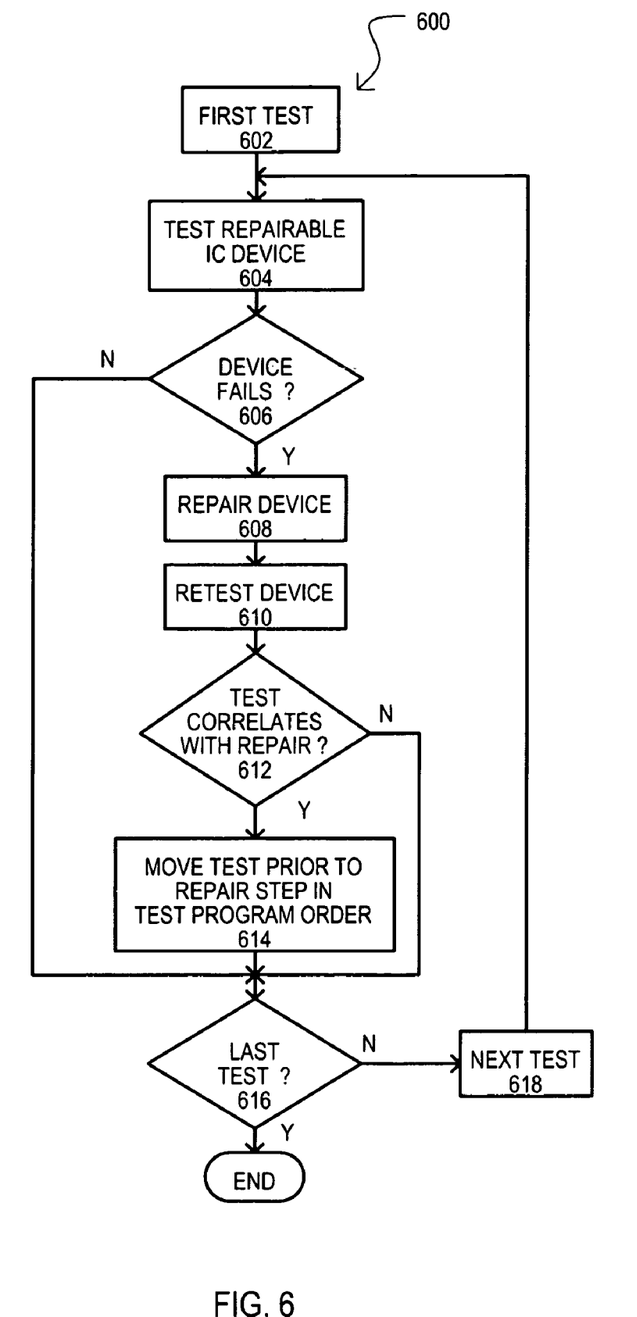
FIG. 6 is a flow diagram of a fifth embodiment.

Referring now to FIG. 6, a method according to another embodiment is shown in a flow diagram and designated by the general reference character 600. Method 600 can utilize acquired test data to reorder tests of an overall test program for optimal use with a repair step in a fabrication process.

A method 600 can include starting with a first test of a number of tests having a particular order (step 602). A repairable IC device can then be tested (step 604). If the tested IC device fails the test (Y from 606), the device can be subject to a repair operation (step 608). For example, such a step can include enabling replacement/redundant circuits via some programming step, such as opening fuses by laser, as but one very particular example. A repaired IC device can then be retested with the same test (step 610).

Test results generated prior to repair and after repair can checked to see if they correlate with one another (step 612). Such a step can determine if the repair step significantly reduced the failure rate of a test. For example, correlation can exist if the repair step eliminates all failures, or reduces the number of failures below some predetermined limit. If such a correlation exists (Y from 612) the test can be moved in a test order prior to a repair step (if not already in such a position) (step 614).

If a tested IC device did not fail a test (N from 606), or following step 614, a method 600 can determine if all tests have been executed (step 616). If all tests have been executed (Y from 616) the method 600 can end. If not (N from 616), a next test in the test sequence can be selected (step 618), and the flow represented by steps 604 to 614 can be repeated.

In this way, tests that capture "repairable" defects can be earmarked and placed in a most effective position in a test flow. For example, tests correlating to laser repair can be placed at a "pre-laser" position, such as a "sort-1" test (first wafer sort insert). In this way, failures at a sort-1 test can be potentially "repaired" via redundant elements, increasing yield.

Figure 7:
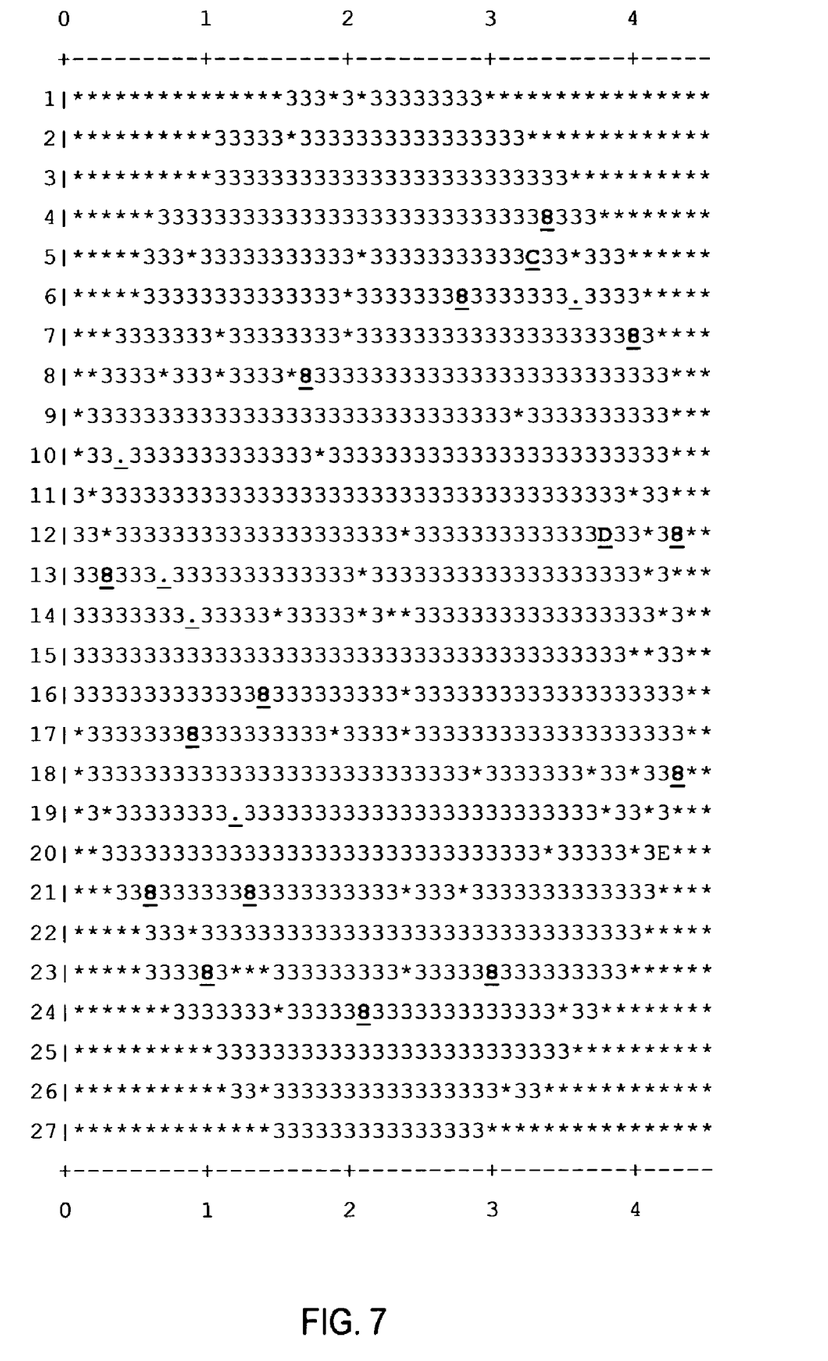
FIG. 7 is a diagram showing a summary map of a wafer that can be included and/or processed by the embodiments.

Referring now to FIG. 7, a summary map (which can be contained in a test summary file) for a given wafer is shown in a diagram. The summary map shows the classification (i.e., binning) of each tested die on the wafer. Numbers along a top and bottom line can show an X position of a die. Numbers along a left hand vertical can represent a Y position. A "*" can indicate an invalid position (position that does not include a tested die). Underscored numbers can represent failed die and looking at the coordinate of the fail die, an associated map can be derived.

Figure 8:
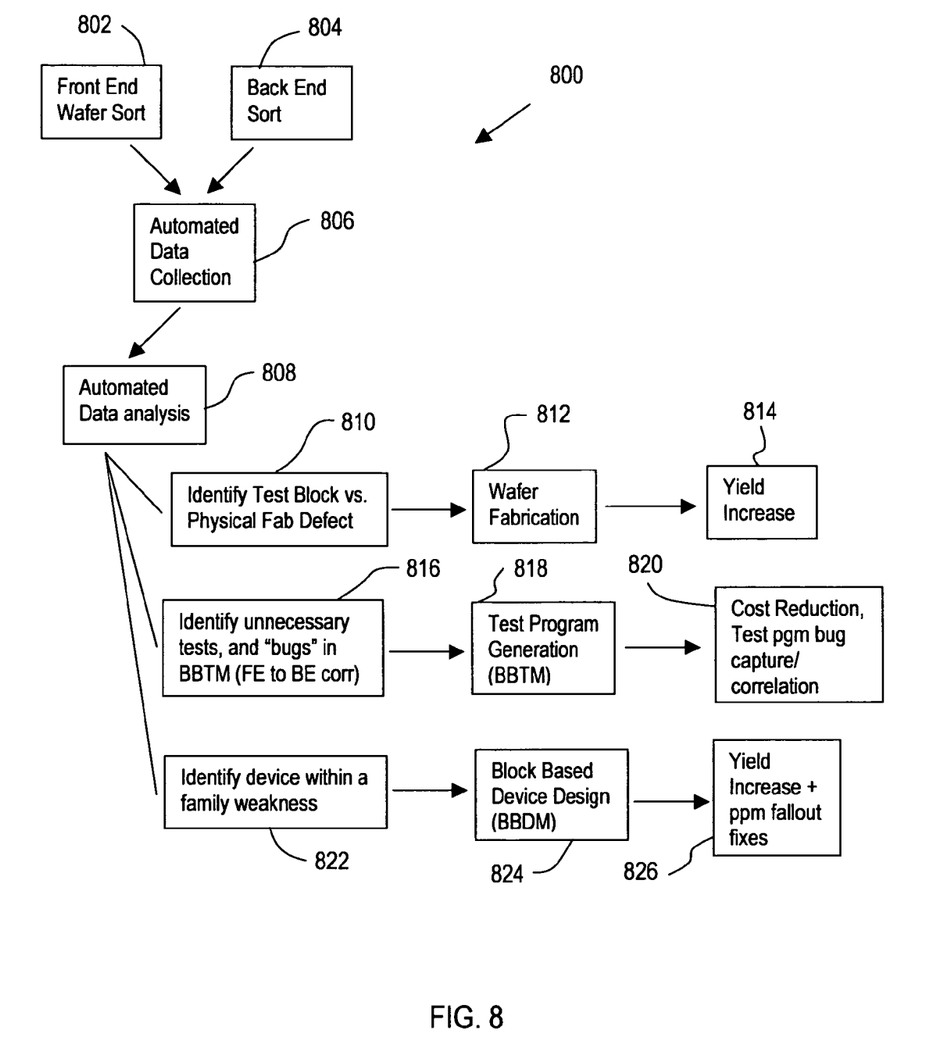
FIG. 8 is a block diagram showing a sixth embodiment.

Referring now to FIG. 8, a method according to another embodiment is shown in a block schematic diagram, and designated by the general reference character 800. A method 800 can include examples of remedial steps that can be implemented in response to test data collection and evaluation, like that shown in the embodiments above. A method 800 can include a front end wafer sort 802 and a back end sort 804. Such steps can generate FE and BE test data associated with the same IC devices. Such data can be automatically collected 806. Automatic collection can include test equipment automatically sending test result data via a communication channel, and/or a system reading such test data from automatic test equipment. In addition, such a step can include translating test data into a bit map or string, with each bit position representing a test result. Further, such bit data can be transformed into some other non-binary representation.

A method 800 can automatically analyze test data 808. Such a step can include analyzing both FE and BE data according to the various techniques noted above. For example, such a test can identify zero coverage tests, unique coverage tests, and non-unique coverage test sets. Further, failure rates within the same family or between different options can also be compared. According to the data analysis of 808, various actions can be taken.

In the particular example of FIG. 8, according to analysis results, an actual physical manufacturing (e.g., fab) defect can be distinguished from a test block flaw 810. With such data, a wafer fabrication process can be adjusted 812, which can result in yield increase 814.

Referring still to FIG. 8, in response to analysis results, tests that are unnecessary and/or that represents flawed tests resulting from a BBTM can be identified 816. A test program generation method can be modified (e.g., unnecessary tests removed, flawed tests changed or removed, test generation criteria changed) 818, and as a result, test costs can be reduced and/or test program bugs eliminated 820.

Still further, in response to analysis results, a device from a family having a particular weakness can be identified 822. In response, a BBDM can be modified or examined 824 to address the family member weakness. This can also result in yield increases, or the need for device repair steps 826.

In this way, various actions can be taken in response to a FE to BE analysis that can increase a device design, test and/or manufacturing process.

Figure 9:
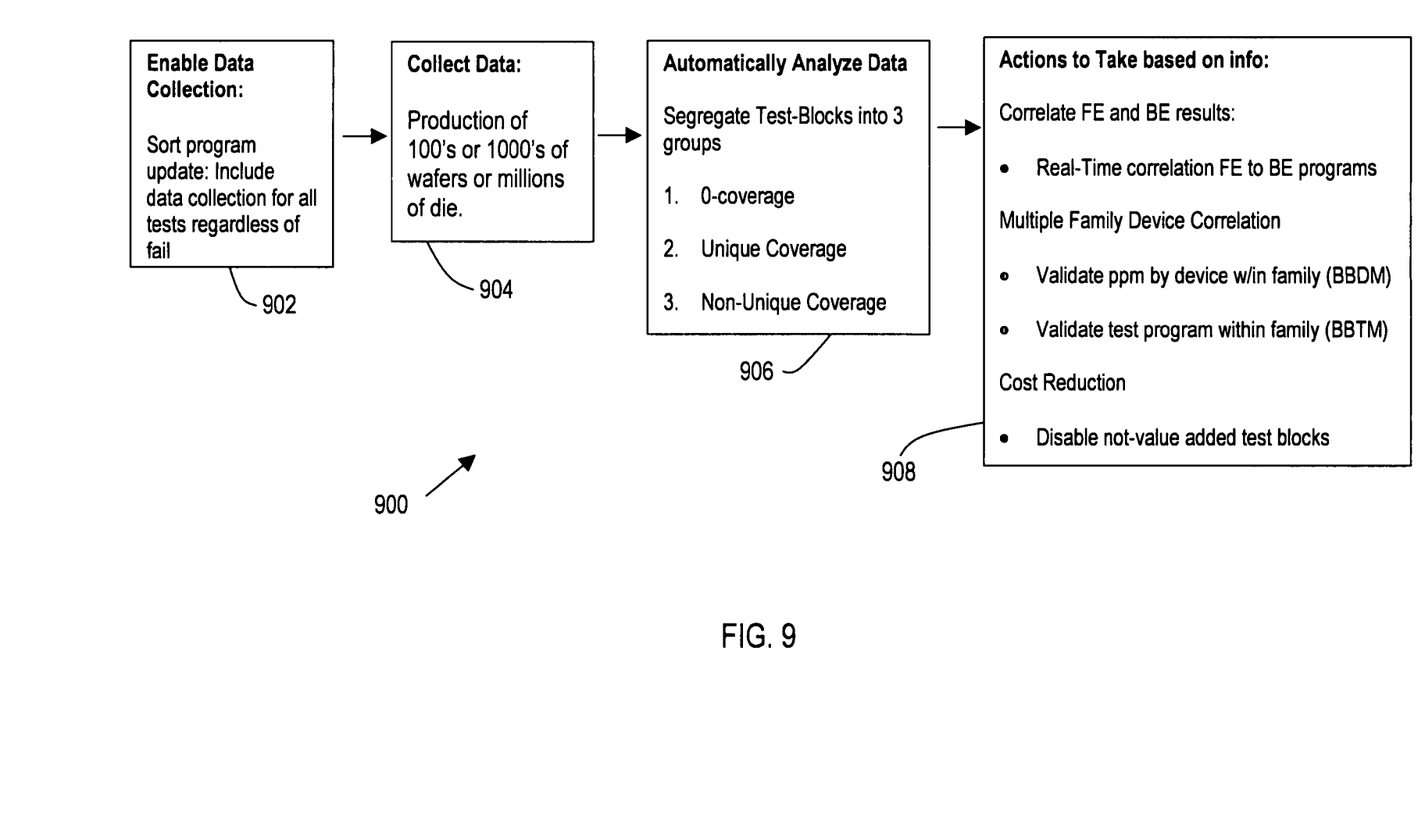
FIG. 9 is a block diagram showing decision steps according to a seventh embodiment.

Referring now to FIG. 9, a block level diagram shows decision steps that can be executed according to an embodiment. FIG. 9 can be conceptualized as a guide for performing the data analysis shown in FIG. 8. That is, FIG. 9 can be considered a block form representation of actions occurring in FIG. 8.

Steps shown in FIG. 9 can include an enable data collection step 902. In the example shown, this step can include updating a sort program to include test results for all die, to associate test results of each die with a die location, and to not stop a series of tests on a die when any one test shows a fail. This can modify both wafer sort test programs and back end test programs.

Test data can be collected 904. In the very particular example of FIG. 9, such a step can include collecting data for hundreds and/or thousands of dies. Such data being both FE and BE data for each die.

Resulting test data can be automatically analyzed 906. In FIG. 9, this step can include segregating test blocks into at least three groups: zero coverage tests, unique coverage tests, and non-unique coverage tests.

Referring still to FIG. 9, according to the test segregation results, actions can be taken to improve manufacturing, testing or design 908. FE and BE test results can be correlated with one another in real time. Thus, analysis results will be rapidly available, and not require such time/labor intensive approaches, such as a conventional Qualification Test Plan described above. As noted above, correlation for device families and/or device options can provide valuable information. More particularly, comparable failure rates in the same family can validate a BBDM device and/or validate a family test program, such as one generated from a BBTM. Still further, FE to BE correlation can identify non-value added tests, allowing such tests to be removed from a program.

While various methods have been described above, alternate embodiments can take the form of systems for executing FE to BE test correlation. Examples of such embodiments will now be described.

Figure 10:
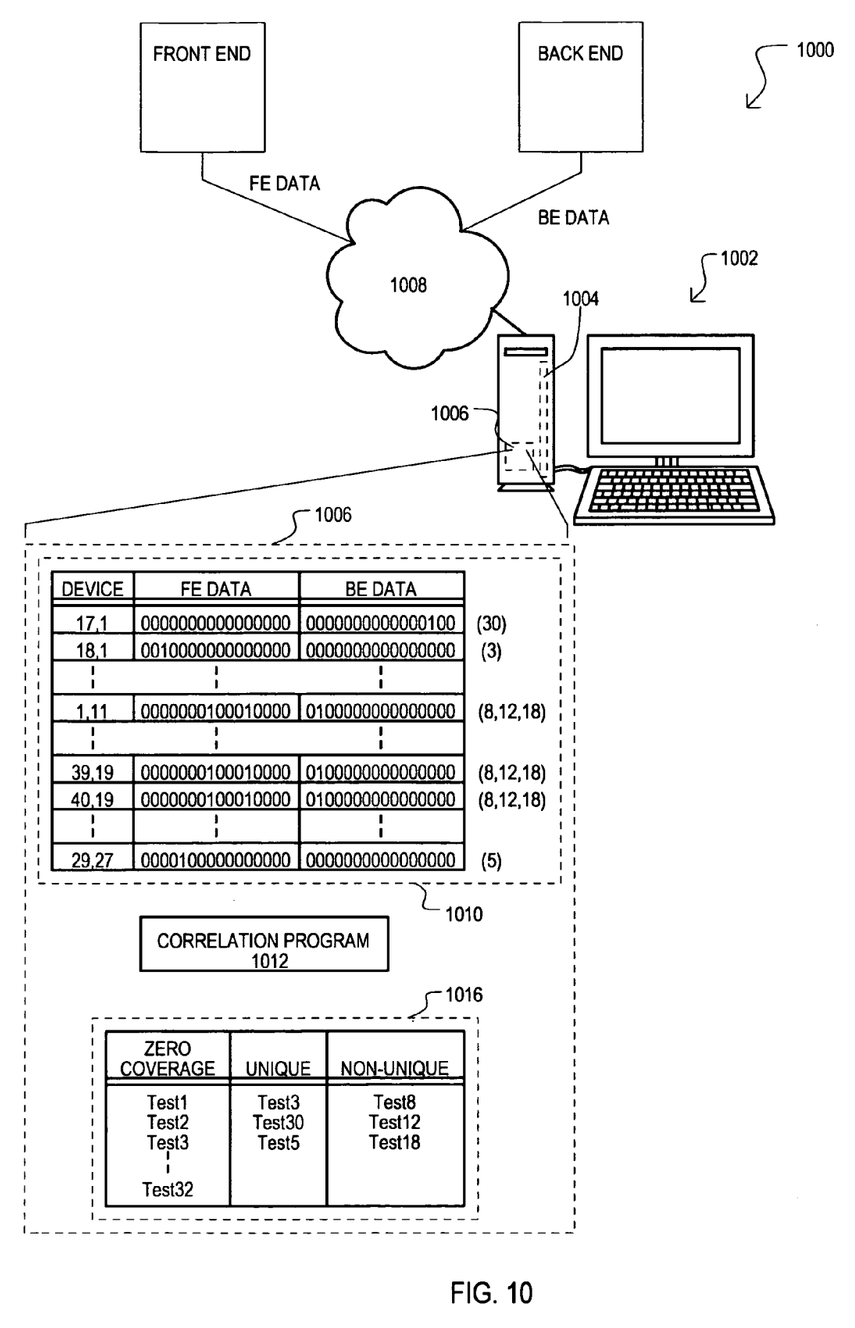
FIG. 10 is a block diagram showing a system according to another embodiment.

Referring now to FIG. 10, a test system according to an embodiment is shown in a block diagram and designated by the general reference character 1000. A test system 1000 can include one or more computing devices 1002 having one or more processors 1004 and one or more data storage/holding areas 1006. A computing device 1002 can be a mainframe computing device, personal computer, or specialized controller to name but a few examples.

A test system 1000 can be connected to receive FE test data (FE DATA) and back end test data (BE DATA). In the particular example of FIG. 10, test system 1000 can receive FE DATA and BE DATA via a communication path 1008. A communication path 1008 can include a network, such as a local area network (LAN), wide area network (WAN), the Internet, a direct physical wiring, or a wireless connection, or some combination thereof, as but a few examples. Such a communication path 1008 can enable FE DATA and/or BE DATA to be transmitted to test system 1000 by testers (i.e., data is pushed). In addition or alternatively, FE DATA and/or BE DATA can be read from test locations by test system 1000. A communication path 1008 can be particular beneficial for automated data acquisition. However, alternate embodiments could include entry of test data into a system via personnel.

Referring still to FIG. 10, an example of data contained within a data storage/holding area 1006 in shown in detail. It is understood that such data can be stored in a nonvolatile storage medium (e.g., magnetic hard disk, nonvolatile solid state), or can be read into a volatile storage media (system RAM), or both. Storage/holding area 1006 can contain combined test data 1010 that can include an IC device identifier DEVICE and the FE DATA and BE DATA test results for such a device. In the particular example shown, FE DATA and BE DATA form a binary string, with each digit representing a test status (1=fail, 0=pass). For ease of understanding, failed tests are shown in parentheses on the right hand side of each entry.

A storage/holding area 1006 can also include a correlation program 1012, which can be series of steps executable by processor(s) 1004. A correlation program 1012 can analyze the combined test data 1010, and according to the methods noted above, can categorize tests and correlate tests between devices. A correlation program 1012 can store such results in storage/holding area 1006 as analysis results 1016.

In the example of FIG. 10, analysis results 1016 include the categorization of tests that generate failures.

In this way, a system can receive, store, and analyze FE and BE test data for the same IC devices.

Figure 11:
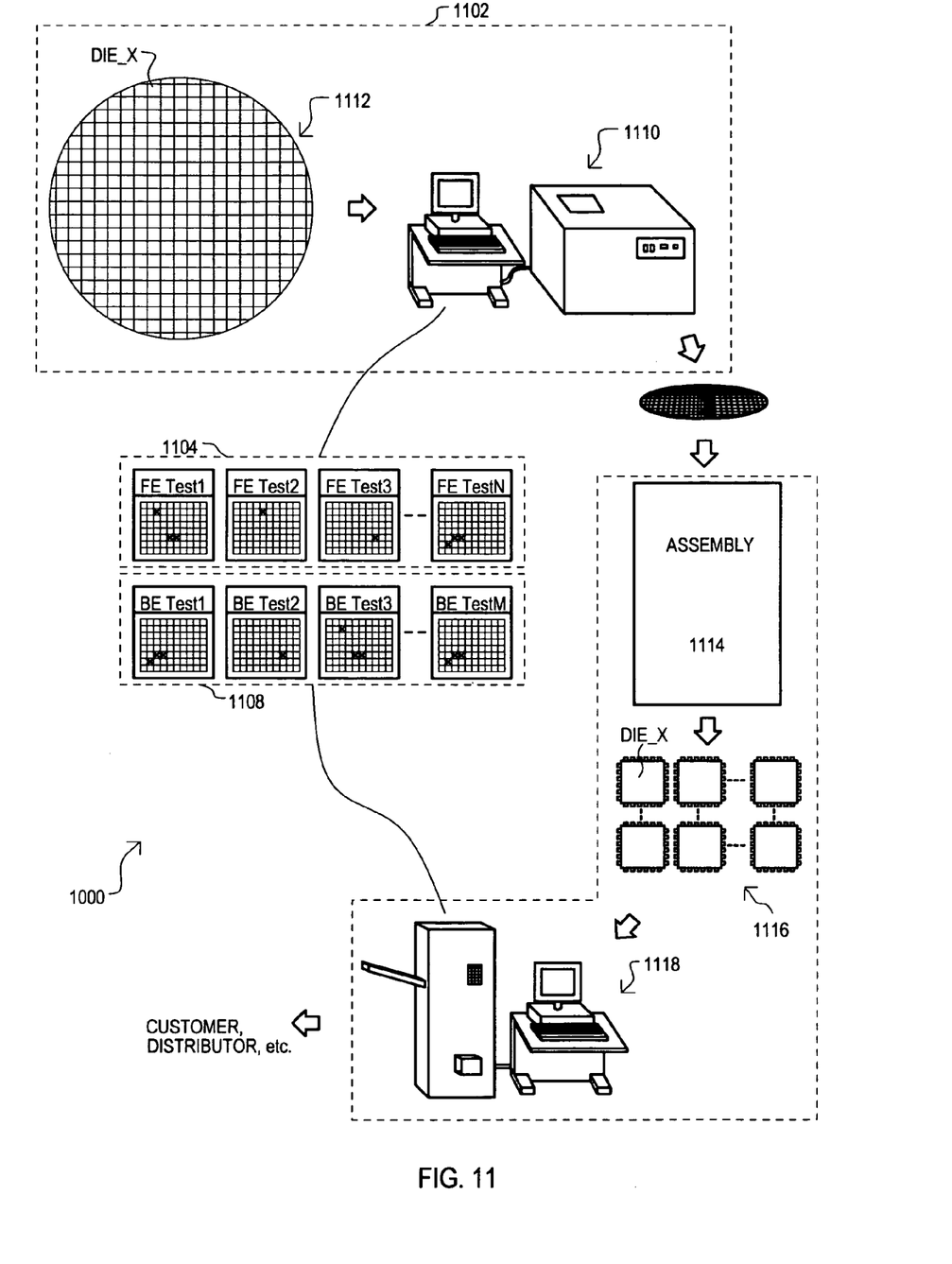
FIG. 11 is a diagram showing a system according to yet another embodiment.

Referring now to FIG. 11, a testing system is shown in a diagrammatic representation, and indicated by the general reference character 1100. A system 1100 can include a front end section 1102 that automatically generates front end test data 1104, and a back end section 1106 that automatically generates back end test data 1108. A front end section 1102 can include wafer sort test equipment (e.g., 1110) that can receive IC devices in the form of a wafer 1112. Wafer 1112 can identify different IC devices by position. One particular IC device DIE_X is shown by way of example. Such wafer sort test equipment can execute a number of tests on IC device formed in the wafer. Advantageously, wafer sort test equipment can test multiple dice at one time. In the particular example shown, front end test data 1104 can include failure maps for each test (FE Test1 to FE TestN) that indicate failure of a die according to die position. Of course, as noted above, such maps can take the form of a series of bits.

A back end section 1106 can receive IC dice in wafer form. Such wafers can be sawed, or otherwise separated into individual dice, and then assembled into packaged devices at an assembly location (e.g., 1114). Packaged devices 1116 can have identifier values, either programmed electronically or printed on the packages, that allow a packaged device to be identified by the die (or dice) contained within. By way of example, one of packaged devices 1116 contains the die DIE_X identified in wafer 1112. Packaged devices 1116 can be tested within automatic test equipment (ATE) (e.g., 1118) to generate back end test data 1108. In the particular example shown, back test data 1104 is represented in the same format as front end test data.

Reference to FIG. 11 can show how correlation between FE and BE test data can be recognized. As shown, a test pattern generated by front end test FE Test1 can have the same pattern as that of back end test BE Test3. Consequently, these two tests can be categorized as non-unique, and one test (most likely BE Test3) can be a candidate for removal. Similarly, front end test FE TestN can have a same failure pattern as back end tests BE Test1 and BE TestM. Thus, these three tests can belong to a same non-unique set. Tests FE Test2, FE Test3 and BE Test2 can be categorized as unique. Of course, categorization of tests as being non-unique need not be an exact match between failures, but can be some predetermined correlation threshold.

In this way, a test system can acquire and correlate back end and front end test data for the same devices.

Methods and system according to the embodiments can have advantages, including the potential to detect more tests that can be removed from an overall test sequence by specifically identifying redundant tests. This can lead to greater test time reduction. Also, a front end to back end test program correlation (for each test block) can be obtained during production testing, thus not introduce additional steps of programs into an existing test flow.

In addition, the embodiments can potentially reduce wafer sort test time, and identify those tests that are capturing unique failures (without test block peer) and the quantitative value (strength) of each test/test-block. A peer testblock can be that test which captures the same defect as other tests. This can allow correlation of front-end and back-end tests and their effectiveness by each test block. The net effect in one implementation was a 25% or greater reduction in test time, and easy identification of value-added tests.

Embodiments of the present invention are well suited to performing various other steps or variations of the steps recited herein, and in a sequence other than that depicted and/or described herein.

For purposes of clarity, many of the details of the various embodiments and the methods of designing and manufacturing the same that are widely known and are not relevant to the present invention have been omitted from the following description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A system for integrated device test correlation, comprising:
   at least one processor; and
   at least one data store that stores
      combined test data value for each of a plurality of integrated circuits (ICs), each combined test data value including wafer test results performed on an IC while part of a wafer, and package test results performed after the IC has been assembled into package, and
      test result data including at least a non-unique coverage group identifying any wafer tests and package tests that fail for the same IC for a predetermined number of ICs.

2. The system of claim 1, wherein:
   at least one processor is coupled to receive
      wafer test data associating each IC formed in a wafer with a plurality of wafer test results performed on the IC while part of the wafer, and
      package test data associating each IC formed in a package with a plurality of package test results performed on the package.

3. The system of claim 2, wherein:
   the wafer test data comprises a bit value corresponding to each wafer test, and
   the package test data comprises a bit value corresponding to each package test.

4. The system of claim 1, wherein:
   the at least one data store further stores combined test data having wafer test results and package test results for each of the plurality of ICs.

5. The system of claim 4, wherein:
   the combined test data value comprises a bit value corresponding to each test.

6. The system of claim 4, wherein:
   the combined test data value comprises at least one non-binary number value that when converted to binary form comprises a plurality of bit values, each corresponding to a wafer sort test or package test.

7. The system of claim 1, wherein:
   the at least one data store stores correlation program that includes a series of machine readable steps, including
   determining if any wafer test failure or package test failure fail for the same predetermined number of dice.

8. The system of claim 1, wherein:
   the test result data further includes
   a unique coverage group identifying any wafer tests or package tests that do not have failures that correlate with failures of any other wafer tests or package tests.

9. The system of claim 1, wherein:
   the test result data further includes
   a zero coverage group identifying any wafer tests or package tests that do not indicate any significant number of failed ICs.

10. A method for integrated device testing, comprising the steps of:
    receiving wafer test data that identifies wafer test failures with the dice tested while part of a shared common substrate;
    receiving package test data that identifies test failures for at least a subset of the dice after the dice have been separated and assembled into different packages;
    identifying non-unique coverage test sets that include at least one wafer test or package test that generates failures that correlates with failures generated by another wafer test or package test for the same dice; and
    identifying unique coverage tests that include failures generated by wafer tests or package tests that do not correlate with failures generated by any other another wafer test or package test for the same dice.

11. The method of claim 10, further including:
    identifying zero coverage tests that include wafer tests or package tests that do generate significant failure counts for tested dice.

12. The method of claim 10, further including:
revising a test program, comprising
removing at least one of the tests from a non-unique coverage test set.

13. The method of claim 12, wherein:
removing at least one of the tests from a non-unique coverage test set includes removing a package test if the non-unique coverage test set includes at least one wafer test and the package test.

14. The method of claim 10, wherein:
receiving wafer test data includes receiving at least one non-binary wafer test value, and converting the non-binary wafer test value into a binary wafer test value, bit positions of the binary wafer test value representing different wafer test result.

15. The method of claim 10, further including:
receiving field test failures that identify dice that fail after being transported to a user location; and
identifying non-unique coverage test sets that include at least one wafer test or package test that generates failures that correlate with another wafer test or package test or field test for the same predetermined dice.

16. The method of claim 10, further including:
indicating if a failure rate for dice composed of at least one design block does not scale appropriately with other tested dice formed with different numbers of the design blocks.

17. The method of claim 10, further including:
indicating if failure rates for first tested dice do not match other tested dice representing a different option of the same type device.

18. The method of claim 10, further including:
determining if a test correlates with a repair step that eliminates failures detected by the test; and
ensuring the test is placed prior to the repair step in the test sequence.

19. A method of testing integrated circuit (IC) devices, comprising:
correlating test results between a front end of an IC manufacturing process and a back end of the IC manufacturing process;
comparing effectiveness between a test of the front end and a test of the back end; and
based on the effectiveness, removing the test of the back end.

20. The method of claim 19, wherein:
correlating test results includes
automatically capturing wafer sort test data and associating the wafer test data with the die tested,
automatically capturing package test data and associating the package data with a package tested, and
matching wafer sort test data for a die with package test data for the package containing the die.

* * * * *